(12) United States Patent
Chen et al.

(10) Patent No.: US 9,564,336 B2
(45) Date of Patent: Feb. 7, 2017

(54) NOR FLASH DEVICE MANUFACTURING METHOD

(75) Inventors: Yawei Chen, Jiangsu (CN); Zhihong Jian, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 14/130,460

(22) PCT Filed: Jul. 31, 2012

(86) PCT No.: PCT/CN2012/079460
§ 371 (c)(1),
(2), (4) Date: Dec. 31, 2013

(87) PCT Pub. No.: WO2013/020474
PCT Pub. Date: Feb. 14, 2013

(65) Prior Publication Data
US 2014/0154878 A1 Jun. 5, 2014

(30) Foreign Application Priority Data
Aug. 10, 2011 (CN) .......................... 2011 1 0228111

(51) Int. Cl.
*H01L 21/4763* (2006.01)
*H01L 21/306* (2006.01)
(Continued)

(52) U.S. Cl.
CPC ......... *H01L 21/306* (2013.01); *H01L 21/0206* (2013.01); *H01L 21/02071* (2013.01);
(Continued)

(58) Field of Classification Search
CPC ............. H01L 21/67017; H01L 21/67161; H01L 21/31138; H01L 21/31116; H01L 21/02046; H01L 21/306; H01L 21/0206; H01L 21/02071; H01L 21/28273; H01L 21/32139; H01L 21/28123; H01L 27/11521
(Continued)

(56) References Cited

U.S. PATENT DOCUMENTS 6,020,091 A * 2/2000 Lee ..................... H01L 21/0332
257/E21.035
6,315,819 B1 * 11/2001 Tokushima ............... C23F 4/00
257/E21.311
(Continued)

FOREIGN PATENT DOCUMENTS

CN 1430264 A 7/2003
CN 101651097 A 2/2010
(Continued)

OTHER PUBLICATIONS

American Gas Association, Purging Principles and Practice, 3rd Edition, 2001.*
(Continued)

*Primary Examiner* — Robert Bachner
(74) *Attorney, Agent, or Firm* — Muncy, Geissler, Olds & Lowe, P.C.

(57) ABSTRACT

An embodiment of a NOR Flash device manufacturing method includes: providing a substrate having a first polycrystalline silicon layer disposed thereon; forming a first hard mask layer on the first polycrystalline silicon layer; etching the first hard mask layer to form a first opening, and cleaning a gas pipeline connected to an etching cavity before etching the first hard mask layer; forming a second hard mask layer on the first hard mask layer, and the second hard mask layer covers the bottom and side wall of the first opening; etching the second hard mask layer to form a second opening, the width of the second opening is smaller than the width of the first opening; etching the first poly- (Continued)

crystalline silicon, forming a floating gate. The NOR Flash device manufacturing method improves the yield of the NOR Flash device.

18 Claims, 6 Drawing Sheets

(51) Int. Cl.
    *H01L 21/3213*     (2006.01)
    *H01L 27/115*     (2006.01)
    *H01L 21/02*     (2006.01)
    *H01L 21/28*     (2006.01)

(52) U.S. Cl.
CPC .. *H01L 21/28273* (2013.01); *H01L 21/32139* (2013.01); *H01L 27/11521* (2013.01); *H01L 21/28123* (2013.01)

(58) Field of Classification Search
USPC .............................. 438/593, 594, 257; 216/67
See application file for complete search history.

(56) References Cited

U.S. PATENT DOCUMENTS

| | | | |
|---|---|---|---|
| 2002/0038681 A1* | 4/2002 | Nakatani | ................ B82Y 10/00 148/421 |
| 2003/0173333 A1* | 9/2003 | Wang et al. | ..................... 216/67 |
| 2007/0004141 A1* | 1/2007 | Kim | .................. H01L 21/28114 438/257 |
| 2007/0066071 A1* | 3/2007 | Chen | ......................... C11D 7/08 438/704 |
| 2007/0240826 A1* | 10/2007 | Yao | ................... H01L 21/67069 156/345.29 |
| 2009/0117728 A1 | 5/2009 | Kim | |
| 2009/0142914 A1* | 6/2009 | Jung | ................. H01L 27/11521 438/594 |
| 2009/0311842 A1* | 12/2009 | Kuo | ......................... H01L 28/91 438/396 |
| 2011/0272594 A1* | 11/2011 | Graf | ...................... H01J 27/026 250/423 R |

FOREIGN PATENT DOCUMENTS

| KR | 20090044918 A | 5/2009 |
|---|---|---|
| KR | 20100074650 A | 7/2010 |

OTHER PUBLICATIONS

Anthony C. Jones, Michael L. Hitchman, Chemical Vapour Deposition: Precursors, Processes and Applications, 2009, Royal Society of Chemistry, p. 296.*

* cited by examiner

NOR FLASH DEVICE MANUFACTURING METHOD

FIELD OF THE INVENTION

The present disclosure relates to the field of semiconductor device manufacturing process, and more particularly relates to a method of manufacturing a NOR Flash device.

BACKGROUND OF THE INVENTION

NOR Flash device is a type of non-volatile flash memory, which is characterized by the implementation of the chip. The application can be run in the flash memory directly without reading the code to system RAM (random access memory); thus it has higher transmission efficiency.

Referring to FIG. 1, a schematic cross-sectional view of a conventional NOR Flash device is shown, which includes a substrate 1, a gate dielectric layer 2, a floating gate 3, a laminated dielectric layer 4 (usually ONO layer), and a control gate 5, which are positioned on a substrate 1, successively. A source region and a drain region are provided on the substrate 1 at both sides of the floating gate 3, which are not shown because the figure only contains two dimensions.

During the manufacturing process of the NOR Flash device with a size of 0.13 μm or less, in order to decrease an area of the storage region while maintaining a appropriate device coupling ratio, referring to FIG. 2 through FIG. 6, a method according to the prior art usually includes: forming a gate dielectric layer (not shown) and a first polycrystalline silicon layer 101 successively on the substrate 1; forming a first hard mask layer on the first polycrystalline silicon layer, etching the first hard mask layer 102 to form a first opening 103; forming a second hard mask layer 104 on the first hard mask layer 102, the second hard mask layer 104 covers a bottom and a sidewall of the first opening; etching the second hard mask layer 104 to form a second opening 105 using a self-aligning process, a width of the second opening 105 is smaller than a width of the first opening; etching the first polycrystalline silicon layer to form a floating gate 106 using the self-aligning process. A laminated dielectric layer and a control gate are formed on the floating gate 106, which will not be further described.

In the conventional photolithography technique, the distance between adjacent float gates is reduced, such that an area of the storage region is decreased while maintaining the appropriate device coupling ratio. However, the NOR Flash device fabricated according to the prior art has a poor yield.

SUMMARY OF THE INVENTION

The present disclosure is directed to a method of manufacturing a NOR Flash device to increase the yield of the NOR Flash device, the method includes:

providing a substrate having a first polycrystalline silicon layer disposed thereon;

forming a first hard mask layer on the first polycrystalline silicon layer;

etching the first hard mask layer to form a first opening using a dry etching process, and cleaning a gas pipeline connected to an etching cavity prior to etching the first hard mask layer;

forming a second hard mask layer on the first hard mask layer, wherein the second hard mask layer covers a bottom and a side wall of the first opening;

etching the second hard mask layer to form a second opening using a self-aligning process, wherein a width of the second opening is smaller than a width of the first opening; and etching the first polycrystalline silicon layer to form a floating gate using the self-aligning process.

Preferably, cleaning the gas pipeline connected to the etching cavity prior to etching the first hard mask layer comprises: cleaning a gas pipeline containing CO connected to the etching cavity.

Preferably, etching the first hard mask layer to form the first opening using the dry etching process comprises: spin coating a photoresist layer on the hard mask layer;

exposing the photoresist layer using a mask having a first opening pattern, then developing, and forming a photoresist layer having the first opening pattern, the first opening pattern corresponding with shallow trench isolation region, a source region, and a drain region;

using the photoresist layer having the first opening patterned as a mask and etching the first hard mask layer to form the first opening using the dry etching process, and forming the first opening; and removing the photoresist layer having the first opening patterned.

Preferably, after etching the first hard mask, the method further comprises: cleaning the substrate, and the first polycrystalline silicon layer and the first hard mask disposed thereon.

Preferably, after etching the second hard mask, the method further comprises: cleaning the substrate, and the first polycrystalline silicon layer and the second hard mask disposed thereon.

Preferably, after etching the first polycrystalline silicon layer, the method further comprises: cleaning the substrate and the second hard mask disposed thereon.

Preferably, a SC-1 solution is used during cleaning the substrate, and the first polycrystalline silicon layer and the first hard mask disposed thereon; or during cleaning the substrate, and the first polycrystalline silicon layer and the second hard mask disposed thereon; or during cleaning the substrate and the second hard mask disposed thereon.

Preferably, after forming the floating gate, the method further comprises: forming a laminated dielectric layer and a control gate on the floating gate, sequentially.

Preferably, the first hard mask and the second hard mask are made of SiN.

Preferably, the substrate is a silicon substrate.

A method of manufacturing a NOR Flash device is also provided, which includes:

providing a substrate having a first polycrystalline silicon layer disposed thereon;

forming a first hard mask layer on the first polycrystalline silicon layer;

etching the first hard mask layer to form a first opening using a dry etching process, and cleaning a gas pipeline connected to an etching cavity prior to etching the first hard mask layer;

forming a second hard mask layer on the first hard mask layer, wherein the second hard mask layer covers a bottom and a side wall of the first opening;

etching the second hard mask layer to form a second opening, wherein a width of the second opening is smaller than a width of the first opening; and etching the first polycrystalline silicon to form a floating gate.

Preferably, cleaning the gas pipeline connected to the etching cavity prior to etching the first hard mask layer comprises: cleaning a pipeline containing CO gas connected to the etching cavity.

Preferably, cleaning the gas pipeline connected to the etching cavity prior to etching the first hard mask layer comprises: cleaning a gas pipeline containing Ni connected to the etching cavity.

Preferably, etching the first hard mask layer to form the first opening using the dry etching process comprises:

spin coating a photoresist layer on the hard mask layer;

exposing the photoresist layer using a mask having a first opening pattern, then developing, and forming a photoresist layer having the first opening pattern, the first opening pattern corresponding with shallow trench isolation region, a source region, and a drain region;

using the photoresist layer having the first opening patterned as a mask and etching the first hard mask layer to form the first opening using the dry etching process, and forming the first opening;

removing the photoresist layer having the first opening patterned.

Preferably, after etching the first hard mask to form the first opening, the method further comprises: cleaning the substrate, and the first polycrystalline silicon layer and the first hard mask disposed thereon.

Preferably, after etching the second hard mask to form the second opening, the method further comprises: cleaning the substrate, and the first polycrystalline silicon layer and the second hard mask disposed thereon.

Preferably, after etching the first polycrystalline silicon layer, the method further comprises: cleaning the substrate and the second hard mask disposed thereon.

Preferably, a SC-1 solution is used during cleaning the substrate, and the first polycrystalline silicon layer and the first hard mask disposed thereon; or during cleaning the substrate, and the first polycrystalline silicon layer and the second hard mask disposed thereon; or during cleaning the substrate and the second hard mask dis.

Preferably, after forming the floating gate, the method further comprises: forming a laminated dielectric layer and a control gate on the floating gate.

Preferably, the first hard mask and the second hard mask are made of SiN.

Accordingly, in the method of manufacturing the NOR Flash device according to the present invention, before etching the first hard mask layer, the gas pipeline, especially the CO gas pipeline connected to the etching cavity is cleaned. Therefore, after etching the first hard mask layer, the impurity source (generally metal which can diffuse into the first polycrystalline silicon layer at a high temperature, especially Ni) will not contaminate the first polycrystalline silicon layer, such that the impurity source will not diffuse into and react with the first polycrystalline silicon layer during the subsequent high temperature process (e.g. when forming the second hard mask layer) to form the metal silicide. Consequently, the results of dry etching of the first polycrystalline silicon layer will become anisotropic, rather than isotropic caused by the presence of the metal silicide in the first polycrystalline silicon layer. Then the formed float gate will meet the requirement, and the yield of the NOR Flash device is increased.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

Reference will now be made to the drawings to describe, in detail, embodiments of the present method for mobile phone. It should be noted that references to "an" or "one" embodiment in this disclosure are not necessarily to the same embodiment, and such references mean at least one.

As described in the background of the invention, in the prior art, a two-layered hard mask is used as the mask to etch the first polycrystalline silicon layer, such that the distance between adjacent float gates is further reduced under limited lithography conditions. However, the NOR Flash device fabricated according to the prior art has a poor yield.

Figure 7:
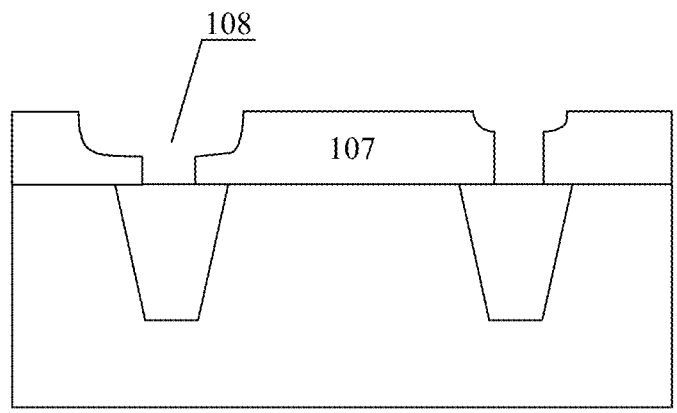
FIG. 7, FIG. 9 and FIG. 10 are schematic cross-sectional views a NOR Flash device manufactured according to the prior art.

It has been found out that, the reason for such a low yield lies in that the obtained float gate usually does not meet the requirement. Referring to FIG. 7, the float gate 107 formed by etching the first polycrystalline silicon layer is shown. Although the etching process is a dry etching process, the result of etching is not anisotropic, and an isotropic opening 108 is defined, such that the float gate fails to meet the requirement, making it easy to lead to the charge leakage, thus resulting in the failure of the NOR Flash device.

Typically, the dry etching process is followed by a cleaning process to the substrate, which usually employs a SC-1 solution (also called APM solution, a mixture solution composed of $NH_4OH$, $H_2O_2$, and $H_2O$) to remove byproducts generated during the dry etching. Therefore, it inevitably raises doubts that whether the first polycrystalline silicon layer is etched by the SC-1 solution during the cleaning, thus defining the isotropic opening.

Figure 8:
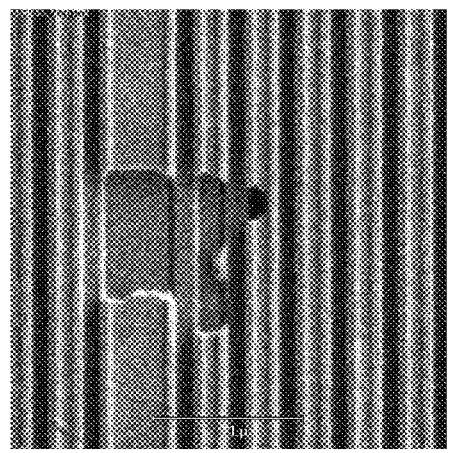
FIG. 8 is a top view of a SEM picture of a NOR Flash device manufactured according to the prior art.

In order to verify whether it is the cleaning that etches the first polycrystalline silicon layer and forms the isotropic opening, the inventor has carried out the following experiments. After etching the first polycrystalline silicon layer using dry etching process, no cleaning process is performed. The microstructure of the device is observed by a scanning electron microscopy (SEM), which is shown in FIG. 8. FIG. 8 is a top view of a SEM picture of a NOR Flash device manufactured according to the prior art, in which the vertical bar is the floating gate, and the etched region in the middle shows that the isotropic opening has already been formed after the dry etching. Therefore, the subsequent cleaning process has nothing to do with the isotropic etching result.

Once the cleaning process has no relationship with the isotropic etching, it is certain that a pervious step is the source of the influence to the first polycrystalline silicon layer, which then causes the etching result to be isotropic. To test that, the inventor has made further researches. The first hard mask and the second hard mask are etched before etching the first polycrystalline silicon layer, the both of which are also dry etching. The dry etching process is typically performed in a particular etching cavity, to which many gas pipelines are connected. Gas can be transported through the gas pipelines to the etching cavity. The transported gas sometimes may be an etching gas, such as CF4, NF3 or SiF4, sometimes may be a cleaning gas, such as N2, and may be one used to remove the undesired polymer formed on the substrate, such as CO. When gas is transported through the gas pipeline, it is inevitable that some impurity sources attached to the pipeline enter the etching cavity. Once these impurity sources are transported into the etching cavity, they may react with the first polycrystalline silicon layer, thus influencing the subsequent etching of the polycrystalline silicon layer.

The inventors have researched various etching processes and various gas content in the etching cavity during the etching process, the results shows that, during the etching of the first hard mask, the pipeline connected to the etching cavity transporting CO contains an impurity source of Ni, which will be transported to the cavity along with CO, such that the Ni content in the cavity far exceeds expectations.

Referring to Table 1, which illustrates the metal content experimental data in the etching cavity when CO gas pipeline is opened or closed during the first hard mask layer etching process. The first column of data, from left to right, shows various metal contents in the etching cavity in the moment when no etching is performed to the first hard mask but with an opened CO gas pipeline. The second column of data shows various metal contents in the etching cavity in the moment while etching the first hard mask but with a closed CO gas pipeline. The third column of data shows various metal contents in the etching cavity in the moment while etching the first hard mask with an opened CO gas pipeline. As indicated by Table 1, during the etching of the first hard mask with an opened CO gas pipeline, the Ni content in the etching cavity far exceeds expectations, while the contents of other metal remains within the required range.

TABLE 1

|    | no run | HM-ET(chamber pump, and close CO gas valve) | HM-ET(3 p cs BL season before HM-ET) |
| --- | --- | --- | --- |
| Na | 1.631 | 2.303 | 1.69 |
| Mg | 0.239 | 0.252 | 0.183 |
| Al | 2.501 | 1.338 | 2.586 |
| K  | 0.387 | 1.38  | 1.456 |
| Ca | 0.855 | 0.336 | 0.001 |
| Ti | 0.001 | 0.001 | 0.001 |
| V  | 0.679 | 0.165 | 0.096 |
| Cr | 0.021 | 0.032 | 0.026 |
| Mn | 0.006 | 0.067 | 0.028 |
| Fe | 0.551 | 0.529 | 0.564 |
| Co | 0.003 | 0.005 | 0.005 |
| Ni | 0.031 | 0.039 | 0.086 |
| Cu | 0.001 | 0.001 | 0.002 |
| Zn | 0.117 | 0.136 | 0.098 |

Figure 9:
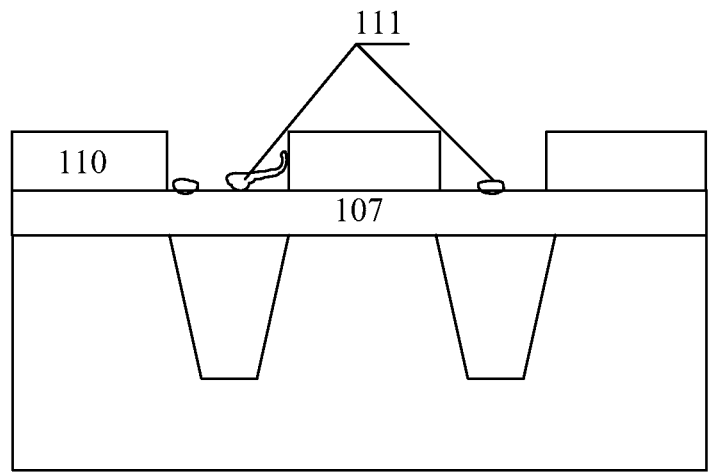
Figure 10:
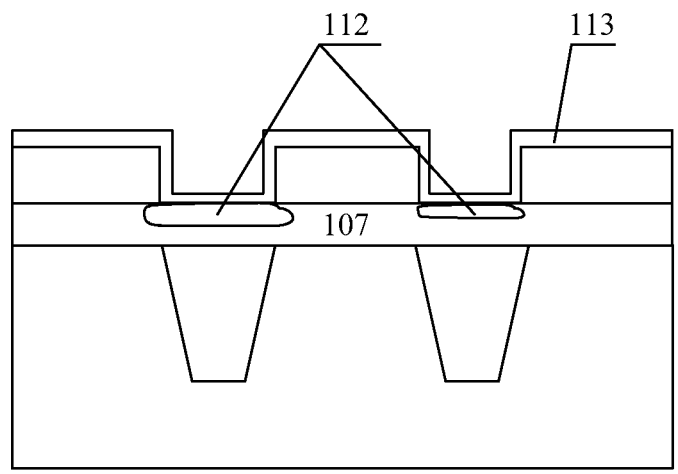

Since the Ni content in the etching cavity far exceeds expectations during the etching of the first hard mask layer with an opened CO gas pipeline, after forming the opening by etching the first hard mask, Ni will be deposited on the first polycrystalline silicon layer within the opening region. FIG. 9 illustrates the first hard mask layer 11 after etching, and Ni particles 111 is deposited on the exposed first polycrystalline silicon layer 107. During the subsequent forming of the second hard mask layer 113, the Ni particles will react with the first polycrystalline silicon layer under a high temperature, thereby forming a nickel-silicon compound 112 on the first polycrystalline silicon layer 112, as shown in FIG. 10. During the subsequent etching of the second hard mask layer, the nickel-silicon compound will not be etched. Nevertheless, when etching the first polycrystalline silicon layer 107, the nickel-silicon compound will be etched, such that the result of the dry etching is isotropic.

Based on this, the present invention provides a method of manufacturing a NOR Flash device. In the manufacturing method, before etching the first hard mask layer, the gas pipeline connected to the etching cavity, especially the CO gas pipeline, is cleaned. Therefore, after etching the first hard mask layer, the impurity source (typically metal) will not contaminate the first polycrystalline silicon layer, such that the impurity source will not diffuse into and react with the first polycrystalline silicon layer during the subsequent high temperature process (e.g. when forming the second hard mask layer) to form the metal silicide. Accordingly, the results of dry etching of the first polycrystalline silicon layer will become anisotropic, rather than isotropic caused by the presence of the metal silicide in the first polycrystalline silicon layer. Then the formed float gate will meet the requirement, and the yield of the NOR Flash device is increased.

Figure 11:
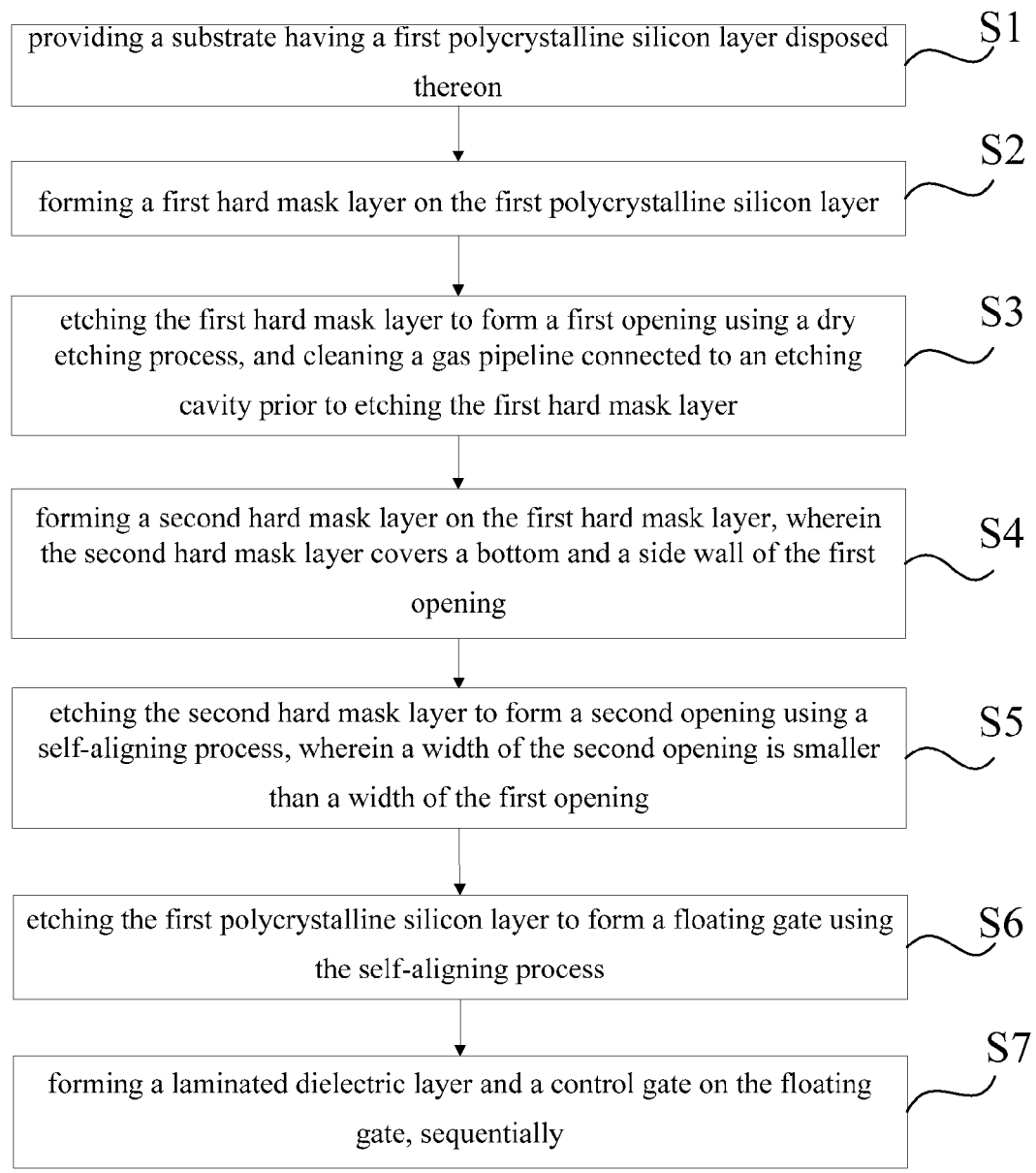
FIG. 11 is a flow chart of a method of manufacturing a NOR Flash device according to an embodiment of the present disclosure.

The method of manufacturing a NOR Flash device according to the present invention will be described in further details, with reference to FIG. 11, the method specifically includes the following steps:

Step S1, providing a substrate having a first polycrystalline silicon layer disposed thereon.

Figure 1:
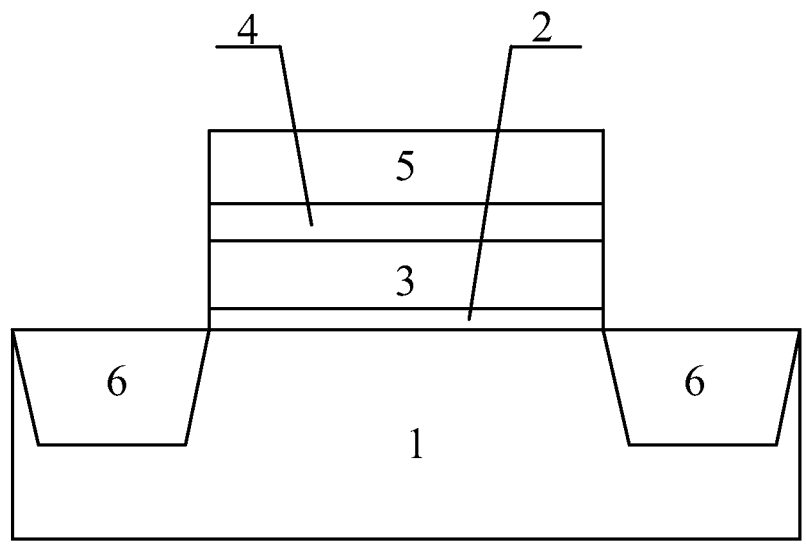
FIG. 1 is a schematic cross-sectional view of a conventional NOR Flash device in the prior art.
Figure 2:
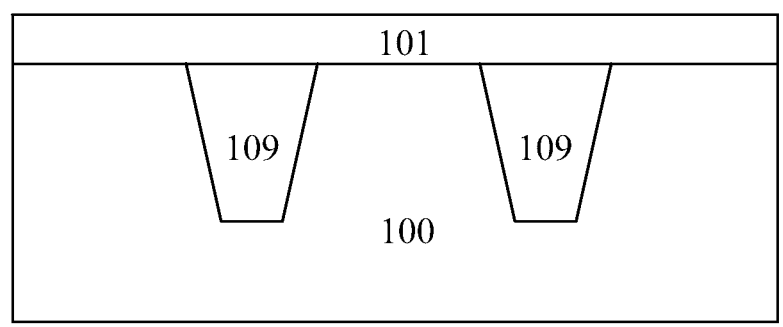
FIG. 2 through FIG. 6 are schematic cross-sectional views showing a method of manufacturing a NOR Flash device according to the present disclosure.

Referring to FIG. 2, the substrate 100 of the present embodiment is a silicon substrate. A gate dielectric layer (not shown) is formed on the substrate 100, and the gate dielectric layer has a first polycrystalline silicon layer 101. A shallow trench isolation region 109 is formed in the substrate 100.

Step S2, forming a first hard mask layer on the first polycrystalline silicon layer.

The first hard mask layer is formed on the first polycrystalline silicon layer by a chemical vapor deposition method, the first hard mask layer of the present embodiment is made of SiN.

Step S3, etching the first hard mask layer to form a first opening using a dry etching process, and cleaning a gas pipeline connected to an etching cavity prior to etching the first hard mask layer.

Before etching the first hard mask layer, the gas pipeline connected to the etching cavity is firstly cleaned, which includes cleaning all the gas pipelines connected to the etching cavity, it therefore can reduce or avoid the impurity source of the gas pipeline from entering the etching cavity. In alternative embodiments, only a CO gas pipeline is cleaned, or other gas pipelines containing Ni are cleaned.

After cleaning the gas pipeline connected to the etching cavity, the first hard mask layer is etched to form a first opening, which includes the following steps:

Step S31, spin coating a photoresist layer on the hard mask layer.

Step S32, exposing the photoresist layer using a mask having a first opening pattern, then developing, and forming a photoresist layer having the first opening pattern, the first opening pattern corresponding with shallow trench isolation region, a source region, and a drain region.

Step S33, using the photoresist layer having the first opening patterned as a mask and etching the first hard mask layer to form the first opening using the dry etching process, and forming the first opening.

Figure 3:
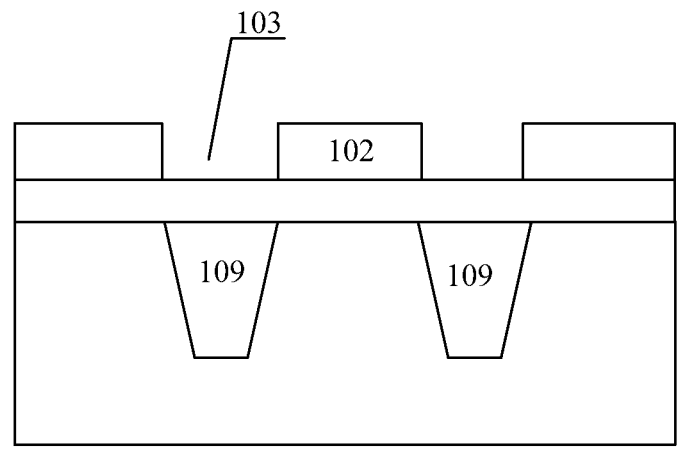

Referring to FIG. 3, the substrate is placed in the etching cavity, the photoresist layer having the first opening patterned is used as a mask, and the first hard mask layer 102 is etched using a dry etching method, such that the first opening 103 is formed. The first opening 103 on the shallow trench isolation region is shown in FIG. 3, while the first opening on the source region and the drain region is not shown. Similar to FIG. 3, the source region and the drain region are not shown in the following figures.

Step S34, removing the photoresist layer having the first opening patterned.

After etching the first hard mask layer, step S34 further includes: cleaning the substrate, the first hard mask on the substrate, and the first polycrystalline silicon layer exposed by etching the first hard mask. The SC-1 solution is used during the cleaning to remove byproducts generated during the dry etching.

Step S4, forming a second hard mask layer on the first hard mask layer, wherein the second hard mask layer covers a bottom and a side wall of the first opening.

Figure 4:
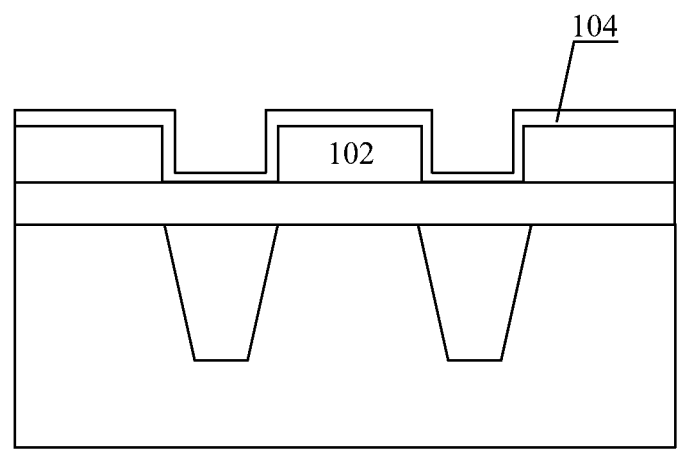

Referring to FIG. 4, the second hard mask layer is formed by a chemical vapor deposition method on the first hard mask layer 102. The second hard mask layer 104 covers the bottom and the side wall of the first opening. The thickness of the second hard mask layer 104 can be controlled by controlling depositing time. It is to be understood that the second hard mask layer 104 does not fill the first opening. The second hard mask layer 104 of the embodiment is also made of SiN.

Step S5, etching the second hard mask layer to form a second opening using a self-aligning process, wherein a width of the second opening is smaller than a width of the first opening.

Figure 5:
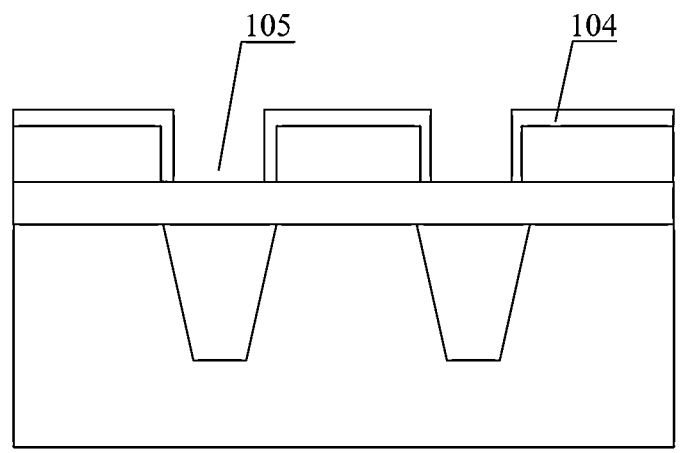

Referring to FIG. 5, the self-alignment process (i.e. not need to use the photoresist with corresponding patterns as the mask) is used to etch the second hard mask layer 104 to form the second opening 105, which has a smaller width than that of the first opening. In an alternative embodiment, the second hard mask layer 104 may be etched using a conventional process with photoresist layer as a mask.

After etching the second hard mask, the substrate, the second hard mask on the substrate, and the first polycrystalline silicon layer exposed by etching the second hard mask are cleaned using the SC-1 solution to remove byproducts generated during the dry etching.

Step S6, etching the first polycrystalline silicon layer to form a floating gate using the self-aligning process.

Figure 6:
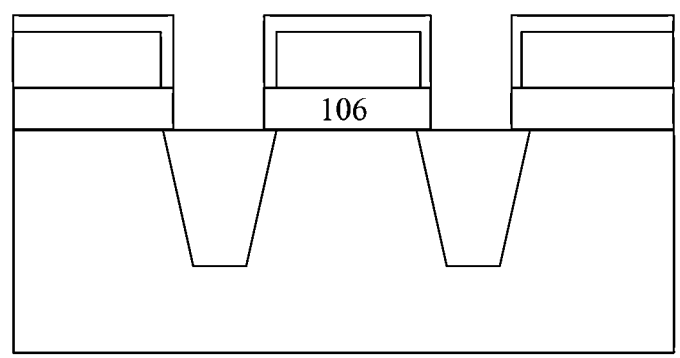

Referring to FIG. 6, the self-alignment process (i.e. not need to use the photoresist with corresponding patterns as the mask, but to use the second hard mask layer as the mask) is used to etch the first polycrystalline silicon layer to form a floating gate 106. In an alternative embodiment, the first polycrystalline silicon layer may be etched using a conventional process with photoresist layer as a mask.

After etching the first polycrystalline silicon layer, the substrate and the second hard mask on the substrate are cleaned using the SC-1 solution to remove byproducts generated during the dry etching.

The second hard mask layer and the first hard mask layer are then removed.

Step S7, forming a laminated dielectric layer and a control gate on the floating gate, sequentially.

Accordingly, in the method of manufacturing the NOR Flash device according to the present invention, before etching the first hard mask layer, the gas pipeline, especially the CO gas pipeline connected to the etching cavity is cleaned. Therefore, after etching the first hard mask layer, the impurity source (typically metal) will not contaminate the first polycrystalline silicon layer, such that the impurity source will not diffuse into and react with the first polycrystalline silicon layer during the subsequent high temperature process (e.g. when forming the second hard mask layer) to form the metal silicide. Accordingly, the results of dry etching of the first polycrystalline silicon layer will become anisotropic, rather than isotropic caused by the presence of the metal silicide in the first polycrystalline silicon layer. Then the formed float gate will meet the requirement, and the yield of the NOR Flash device is increased.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a NOR Flash device, comprising:
   providing a substrate having a first polycrystalline silicon layer disposed thereon;
   forming a first hard mask layer on the first polycrystalline silicon layer;
   cleaning a gas pipeline containing CO connected to an etching cavity thereby preventing impurity source of Ni attached to the gas pipeline containing CO from being injected from the gas pipeline during etching the first hard mask layer;
   etching the first hard mask layer using $CF_4$, $NF_3$ or $SiF_4$ as an etching gas to form a first opening using a dry etching process, and removing an undesired of r formed on the substrate using CO;
   forming a second hard mask layer on the first hard mask layer, wherein the second hard mask layer covers a bottom and a side wall of the first opening, the side wall of the first opening being an etched side surface of the first hard mask layer;
   etching the second hard mask layer to form a second opening using a self-aligning process, wherein a width of the second opening is smaller than a width of the first opening; and
   etching the first polycrystalline silicon layer to form a floating gate using the self-aligning process, wherein a width of an etched portion of the first polycrystalline silicon layer corresponds to the width of the second opening.

2. The method according to claim 1, wherein etching the first hard mask layer to form the first opening using the dry etching process comprises:
- spin coating a photoresist layer on the hard mask layer;
- exposing the photoresist layer using a mask having a first opening pattern, then developing, and forming a photoresist layer having the first opening pattern, the first opening pattern corresponding with shallow trench isolation region, a source region, and a drain region;
- using the photoresist layer having the first opening patterned as a mask and etching the first hard mask layer to form the first opening using the dry etching process, and forming the first opening; and
- removing the photoresist layer having the first opening patterned.

3. The method according to claim 1, wherein after etching the first hard mask, the method further comprises:
- cleaning the substrate, and the first polycrystalline silicon layer and the first hard mask disposed thereon.

4. The method according to claim 3, wherein after etching the second hard mask, the method further comprises:
- cleaning the substrate, and the first polycrystalline silicon layer and the second hard mask disposed thereon.

5. The method according to claim 4, wherein after etching the first polycrystalline silicon layer, the method further comprises:
- cleaning the substrate and the second hard mask disposed thereon.

6. The method according to claim 5, wherein a SC-1 solution is used during cleaning the substrate, and the first polycrystalline silicon layer and the first hard mask disposed thereon; or during cleaning the substrate, and the first polycrystalline silicon layer and the second hard mask disposed thereon; or during cleaning the substrate and the second hard mask disposed thereon.

7. The method according to claim 1, wherein after forming the floating gate, the method further comprises:
- forming a laminated dielectric layer and a control gate on the floating gate, sequentially.

8. The method according to claim 1, wherein the first hard mask and the second hard mask are made of SiN.

9. The method according to claim 1, wherein the substrate is a silicon substrate.

10. A method of manufacturing a NOR Flash device, comprising:
- providing a substrate having a first polycrystalline silicon layer disposed thereon;
- forming a first hard mask layer on the first polycrystalline silicon layer;
- cleaning a gas pipeline containing CO connected to an etching cavity thereby preventing impurity source of Ni attached to the gas pipeline containing CO from being injected from the gas pipeline during etching the first hard mask layer;
- etching the first hard mask layer using $CF_4$, $NF_3$ or $SiF_4$ as an etching gas to form a first opening using a dry etching process, and removing an undesired polymer formed on the substrate using CO;
- forming a second hard mask layer on the first hard mask layer, wherein the second hard mask layer covers a bottom and a side wall of the first opening, the side wall of the first opening being an etched side surface of the first hard mask layer;
- etching the second hard mask layer to form a second opening, wherein a width of the second opening is smaller than a width of the first opening; and
- etching the first polycrystalline silicon to form a floating gate, wherein a width of an etched portion of the first polycrystalline silicon layer corresponds to the width of the second opening.

11. The method according to claim 10, wherein cleaning the gas pipeline connected to the etching cavity prior to etching the first hard mask layer comprises: cleaning a gas pipeline containing Ni connected to the etching cavity.

12. The method according to claim 10, wherein etching the first hard mask layer to form the first opening using the dry etching process comprises:
- spin coating a photoresist layer on the hard mask layer;
- exposing the photoresist layer using a mask having a first opening pattern, then developing, and forming a photoresist layer having the first opening pattern, the first opening pattern corresponding with shallow trench isolation region, a source region, and a drain region;
- using the photoresist layer having the first opening patterned as a mask and etching the first hard mask layer to form the first opening using the dry etching process, and forming the first opening;
- removing the photoresist layer having the first opening patterned.

13. The method according to claim 10, wherein after etching the first hard mask to form the first opening, the method further comprises:
- cleaning the substrate, and the first polycrystalline silicon layer and the first hard mask disposed thereon.

14. The method according to claim 13, wherein after etching the second hard mask to form the second opening, the method further comprises:
- cleaning the substrate, and the first polycrystalline silicon layer and the second hard mask disposed thereon.

15. The method according to claim 14, wherein after etching the first polycrystalline silicon layer, the method further comprises:
- cleaning the substrate and the second hard mask disposed thereon.

16. The method according to claim 15, wherein a SC-1 solution is used during cleaning the substrate, and the first polycrystalline silicon layer and the first hard mask disposed thereon; or during cleaning the substrate, and the first polycrystalline silicon layer and the second hard mask disposed thereon; or during cleaning the substrate and the second hard mask disposed thereon.

17. The method according to claim 10, wherein after forming the floating gate, the method further comprises:
- forming a laminated dielectric layer and a control gate on the floating gate, sequentially.

18. The method according to claim 10, wherein the first hard mask and the second hard mask are made of SiN.

\* \* \* \* \*